United States Patent
Carter et al.

(10) Patent No.: US 6,229,754 B1
(45) Date of Patent: May 8, 2001

(54) WRITE THROUGH FUNCTION FOR A MEMORY

(75) Inventors: Eric Lee Carter; Moon Ho Lee, both of Endicott, NY (US); Michael Richard Ouellette, Westford, VT (US); Geoffrey Wang, Endicott; Michael Hemsley Wood, Hopewell Junction, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/501,393

(22) Filed: Feb. 9, 2000

(51) Int. Cl.[7] ................................................. G11C 8/00
(52) U.S. Cl. ............................ 365/230.05; 365/189.04; 365/233
(58) Field of Search .................. 365/230.05, 230.06, 365/233, 189.04, 189.07

(56) References Cited

U.S. PATENT DOCUMENTS

| 4,862,347 | * | 8/1989 | Rudy | 364/200 |
|---|---|---|---|---|
| 4,998,221 | | 3/1991 | Correale, Jr. | 365/189.07 |
| 5,473,574 | * | 12/1995 | Clemen et al. | 365/230.5 |
| 5,761,147 | * | 6/1998 | Lindner et al. | 365/230.5 |

FOREIGN PATENT DOCUMENTS

| 0434852 | 7/1991 | (EP) | G11C/8/00 |
|---|---|---|---|
| 1-296486 | 11/1989 | (JP) | G11C/11/34 |
| 2146181 | 6/1990 | (JP) | G11C/11/41 |
| 329185 | 2/1991 | (JP) | G11C/11/41 |
| 329187 | 2/1991 | (JP) | G11C/11/41 |
| 3187095 | 8/1991 | (JP) | G11C/11/41 |
| 5347096 | 12/1993 | (JP) | G11C/11/41 |

OTHER PUBLICATIONS

IBM Technical Disclosure Bulletin vol. 30, No. 7, Dec. 1987 "Dense Multi–Port Cell Scheme" pp. 320–321.

* cited by examiner

Primary Examiner—Trong Phan
Assistant Examiner—Thong Le
(74) Attorney, Agent, or Firm—John R. Pivnichny

(57) ABSTRACT

A multi-port electronic memory has a write through capability. Control features for enabling a write through path to an output and subsequently disabling without causing data errors due to design and technology variations are provided. Control features are especially beneficial for use with compilable SRAM books.

12 Claims, 4 Drawing Sheets

WRITE THROUGH FUNCTION FOR A MEMORY

TECHNICAL FIELD

The invention relates to an electronic memory having multi-ports and particularly to the capability of a simultaneous read at one port while writing to the same address at a second port. Even more particularly, the invention relates to such memories with a fast operation and free of timing errors.

BACKGROUND OF THE INVENTION

High speed multi-port random access memories are used in data processing apparatus in conjunction with a general purpose or specialized central processing unit (CPU) to increase performance. One requirement of such memories is the ability to access data, either to read or write, at more than one port during a single machine cycle. For example, a high performance processor may execute an add operation of two addends by requesting the two addends simultaneously from two ports of the memory while also writing the sum (result) back into the memory on the third port all during a single machine cycle. In a pipelined machine the sum to be written back may be the result of the previous operation.

Such multi-port memories are usually required to possess a write through capability. That is, data written to a particular address on one port is required to be read out from that same address on a second port during the same cycle. Under normal operation it is therefore necessary to delay the read operation until after the write operation has placed the data into the memory at the required address. Otherwise the data read could be taken as the previous (old) contents of the address location which is not the desired data. It could also occur that the data read is some indeterminate combination of the old and current data.

Because of the great variety in memory sizes and individual speed variation, a simple delay of the read operation may not be sufficient to handle all variations in the write operation. Alternatively, setting a relatively large delay time to account for the worst possible write operation speed places a severe penalty on overall cycle time which is undesirable in high speed data processing apparatus thereby negating the purpose for which the multi-port array was selected in the first place. It is known in the art that the write through operation is generally the slowest operation of a multi-port memory and therefore tends to be the limiting factor in overall cycle time. (See col. 1 lines 53–61 of U.S. Pat. No. 4,998,221 by Correale, Jr which patent is incorporated herein by reference).

Various solutions have been developed to address this write through limitation. For example, Takeshi Eto in Japanese publication JA3-187095(A) and Loehlein in IBM Technical Disclosure Bulletin Vol. 30, No. 7, December 1987, p. 320–321 both use an address comparator to detect when two ports both desire to operate on the same address. One port is then inhibited. This approach, however, reduces overall system performance by forcing a write through operation to take two cycles while other operations may operate normally.

Clemen et al. in European publication EP0 434 852 A1 describe a multi-port SRAM with a fast single byte write capability. Incorporation of this feature also improves the speed of a write through operation by speeding up the write part of the overall cycle. However, Clemen's read part of the cycle receives data after it is written to the cell at the desires address. (See col.5, lines 15–17).

In U.S. Pat. No. 5,473,574 Clemen et al., which is incorporated herein by reference, describe a scheme for partially overlapping the write and read parts of a write through operation. (See his FIG. 6). Clemens separates a write operation into an address decode period and a write to cell period. Likewise a read operation is separated into a read address decode period and a read from cell period. From his FIG. 6. we see that the read decode period may overlap the write to cell period thereby shortening the overall write through cycle.

Lindner et al. in U.S. Pat. No. 5,761,147 which is incorporated herein by reference, along with Japanese publications JA1-296486, JA2-146181, JA3-29185, JA3-29187, and JA5-347096 all describe a bypass approach to the write through operation of a multi-port RAM. The bypass approach establishes an alternative data path form the write data input to the read data output. An address comparator determines when the write and read addresses coincide. In that case for a write through operation, the normal read path from the memory cell is inhibited and the alternative path is activated. With this approach there is no need to delay the read operation until after the data is written into the memory address. The data to be read is available immediately and can be read out simultaneously with the write operation, providing a much greater speedup in the write through process than provided by the partial overlap of U.S. Pat. No. 5,473,574 described above.

While conceptually appealing, the bypass process suffers from various difficulties when implemented in actual hardware with variations in size, loading, and speed noted above. In particular incorrect data errors can occur due to timing differences and glitches. Glitches are defined in the *Comprehensive Dictionary of Electrical Engineering*, CRC Press, 1999 ISBN 0-8493-3128-5, to mean "(1) an incorrect state of a signal that lasts a short time compared to the clock period of the circuit, (2) slang for a transient that causes equipment crashes, loss of data, or data errors."

Correale, Jr. in U.S. Pat. No. 4,998,221 which is hereby incorporated by reference, describes a bypass process with circuitry to prevent glitches from being sent to the output when performing a write through operation. The circuitry of Correale is most easily explained by reference to FIG. 1. of the present application which is a simplified block diagram based on FIG. 6 of Correale. During a write through operation, write address decode 12 and read address decode 14 blocks will decode the same address and both access the same base cell 16 which represents just one storage cell. In general there will be a plurality of cells (not shown) corresponding to the number of bits in a word of memory. The XO 21 and XO' 22 signals are also generated by the address decoders. N/P transfer gate 18 operates by transferring the write signal on data input 13 to signal line 23 when XO and XO' are active and presents a high impedance to signal line 23 otherwise. XO and XO' are active during a write through operation. The write data is therefore transferred to the memory output buffer 20 directly as well as to base cell 16. N/P transfer gate 19 operates in a similar fashion to transfer gate 18, however the signals XO and XO' are reversed so that the output of the base cell 15 is transferred to output buffer 20 when XO and XO' are not active and presents a high impedance to output buffer 20 otherwise. During a write through operation the output of base cell 15 is therefore ignored and the output buffer 20 receives the correct read data directly from the write data input 13, bypassing base cell 16. After the write through operation is completed, XO and XO' become inactive causing N/P transfer gate 19 to transfer whatever signal is present on base cell output 15 to output buffer 20.

To prevent a glitch form occurring during this transition, read decode 14 is performed as during a normal read operation, to address base cell 16, even though this data is not required because of the bypass path. Then as XO and XO' become inactive causing N/P transfer gate 19 to transfer the base cell output signal 15 to output decoder 20, the potential on either side of transfer gate 19 will be identical, there are no voltage spikes or glitches sent to output buffer 20.

While in the past, memory and logic circuits were not usually combined on a single semiconductor chip due to differing technological process requirements, more recent developments now allow for much more flexibility in intermixing logic and memory circuits on a single chip. It is, now common practice and well established in the art to design standardized circuits and groups of circuits into standardized functions for a particular semiconductor processing technology. A particular chip for performing a particular application eg. an application specific integrated circuit, ASIC, may then be quickly designed by selecting the appropriate pre-designed circuits and functions and interconnecting them as required. Such pre-designed circuits and functions are often referred to as "books."

A static random access memory book has been found to be useful in many ASIC designs. However, a great variety of memory size and word length random access memories are needed for the great variety in ASIC chips. It is therefore common practice to design and provide a random access memory book design which is scalable in that the ASIC chip designer has the freedom to specify a memory size and word length when selecting this book type. A chip design system then appropriately scales the book to include the proper number of memory cells and interconnects the cells to produce the needed memory design. Such a book is said to be a compilable memory book.

The use of compilable books, however, adds additional variations in loading, timing, and performance to overall system operations beyond those variations noted above. It is therefore possible that a multi-port book of a particular size will operate satisfactorily in one ASIC design but will have failures due to the variation above when the same book is compiled to a different size in the same ASIC, or used in a different ASIC, or when mapped to a different set of semi-conductor technology processes. This situation has been found to occur in prior art multi-port static random access memory (SRAM) designs. The invention of Correale noted above may have a failure, for example, if transfer circuit 19 is activated before write data at input 13 has completely overwritten the previously stored data in base cell 16.

In accordance with the teachings of present invention, there is defined a new multi-port random access memory which includes operational features which permit its successful use in a variety of applications as noted above including use as a compilable book.

It is believed that such a multi-port random access memory would constitute a significant advancement in the art.

OBJECTS AND SUMMARY OF THE INVENTION

It is therefore a principal object of present invention to provide and improved write through control apparatus for a multi-port ram.

It is another object to provide a multi-port ram having such an improved control apparatus.

It is a further object to provide a compilable multi-port ram apparatus capable of operating in a great variety of applications and with various semiconductor technology processes.

It is yet another object to provide a method of operating a multi-port ram having such improved capabilities.

These and other objects, are attained in accordance with one embodiment of the invention wherein there is provided a write through control apparatus for a multi-port ram, comprising, a clocked address comparator for generating a single pulse when a write through condition occurs, and a read decode select driver circuit coupled to the address comparator, the driver circuit having a read gate input and a pre-change input both of which become active during a read of the ram, and a read control output which is placed in an inactive state when the single pulse occurs and is held in the inactive state until after the read gate input and the precharge input both return to an inactive state.

In accordance with another embodiment of the invention there is provided a multi-port random access memory, comprising, a memory cell having a data out signal, a first transfer gate for bypass coupling a write port data signal to a read port, a second transfer gate for coupling the data out signal to the read port, and address comparator for determining when a write address at the write port and a read address at the read port are equal, a driver circuit coupled to the address comparator, the driver circuit having a read gate input and a precharge input both of which are adapted to become active during a read of the random access memory, and a read control output which is adapted to enter an inactive state when the comparator determines an equal address condition and remain in the inactive state until after the read gate input and precharge input return to an inactive state, and wherein the first transfer gate is adapted to become active when the read control output is active, and the second transfer gate is adapted to become active when the read control output becomes inactive.

In accordance with another embodiment of the invention there is provided a method of operating a multi-port random access memory, comprising the steps of, providing a memory cell having a data out signal, comparing a write address at a write port of the memory and a read address at a read port of the memory to determine when the addresses are equal, placing a read gate input and a precharge input in an active state during a read of the memory, placing a read control output signal in an inactive state when the addresses are equal and the read gate input and the precharge input are both active, holding the read control output signal in the inactive state until after the read gate input and the precharge input both return to an inactive state, activating a first transfer gate for bypass coupling a write port data signal to a read port when the read control output is active, and activating a second transfer gate for coupling the data out signal to the read port when the read control output is inactive.

BEST MODE FOR CARRYING OUT THE INVENTION

For a better understanding of the present invention, together with other and further objects, advantages and capabilities thereof, reference is made to the following disclosures and the appended claims in connection with the above-described drawings.

Figure 1:
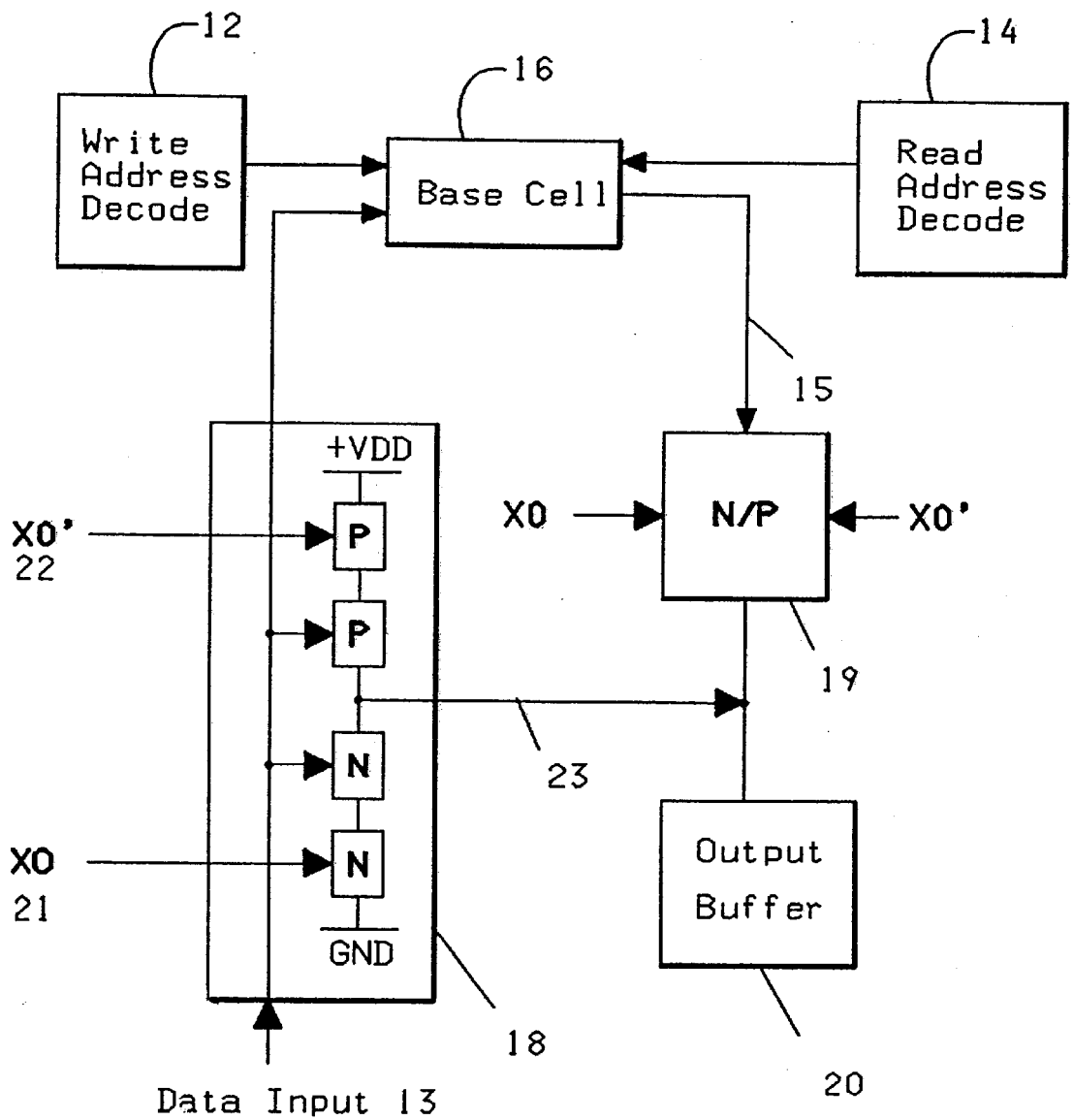
FIG. 1 is a block diagram showing the elements of a prior art multi-port ram.

In FIG. 1 there is shown a block diagram of a multi-port ram having a bypass capability as explained above. Base cell 16 denotes memory apparatus for storing a single bit of a random access memory. There would normally be many additional cells (not shown) for the additional bits in a memory word and additional memory words in the ram. Base cell 16 may be any type of semiconductor circuit used for storage including but not limited to cross coupled inverters, a latch, or a temporary storage element such as a capacitive device. Write and read address decode blocks 12 and 14 respectively may be electronic circuits which decode a binary or other type of encoded address in order to activate the appropriate base cells of a memory word in the ram. The addresses decoded by 12 and 14 are presented at two separate parts of the multi-port ram of FIG. 1.

Data to be written is present on data input 13 and data to be read is available at output buffer 20 which may include a latch or register for temporarily holding the read data. The operation of transfer switches 18 and 19 is explained above.

Figure 2:
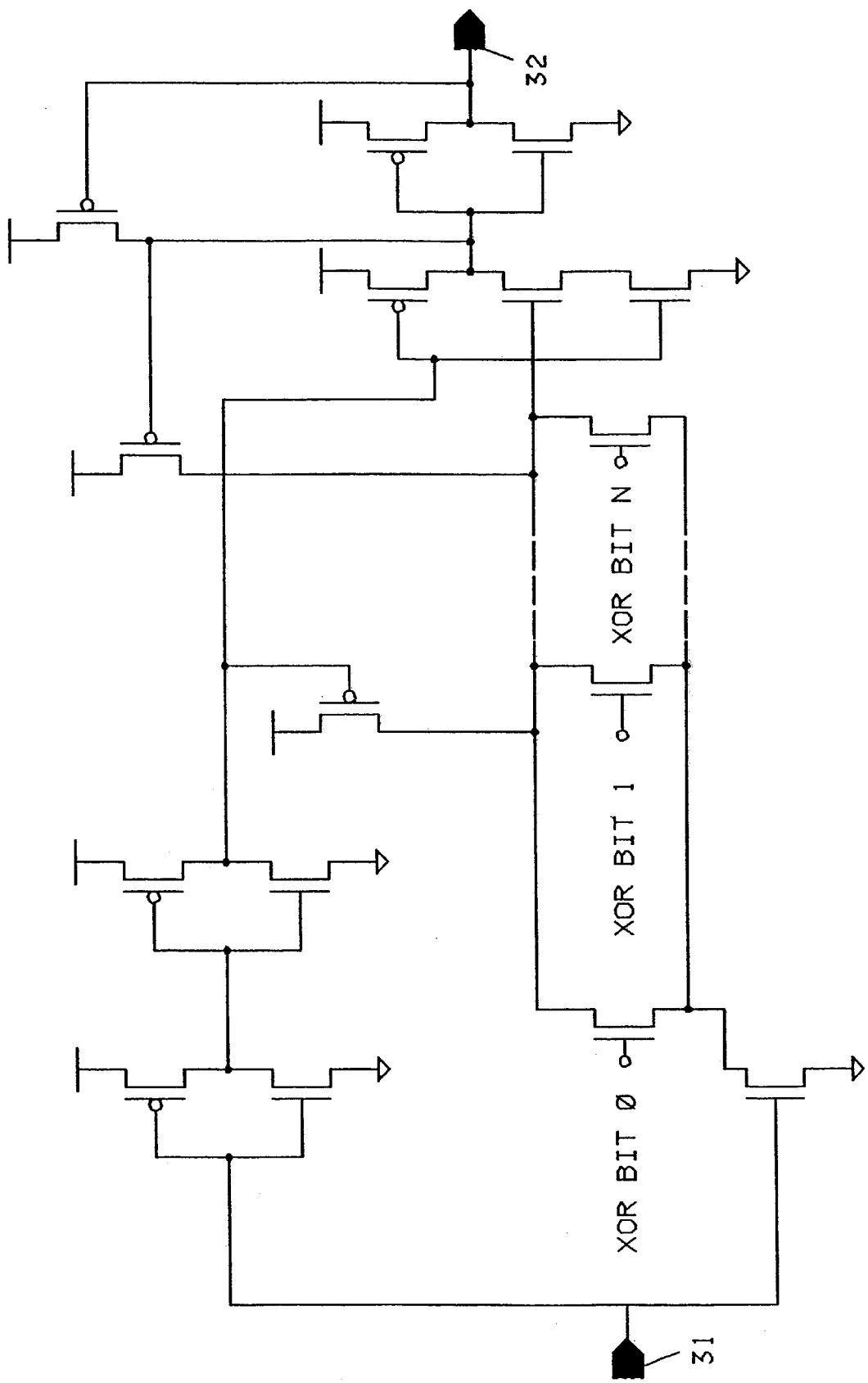
FIG. 2 is a circuit diagram illustrating part of an address comparator apparatus.

In FIG. 2 there is shown part of an address compare circuit. Two individual addresses, such as the read and write addresses of FIG. 1 may be compared by first forming the exclusive-or function of each bit of the address (not shown) and then combining the results of each bit-by-bit exclusive-or in the combinational circuit of FIG. 2. A clock signal 31 may also be combined as shown if desired to gate or control the output 32 of the address comparator circuit.

Figure 3:
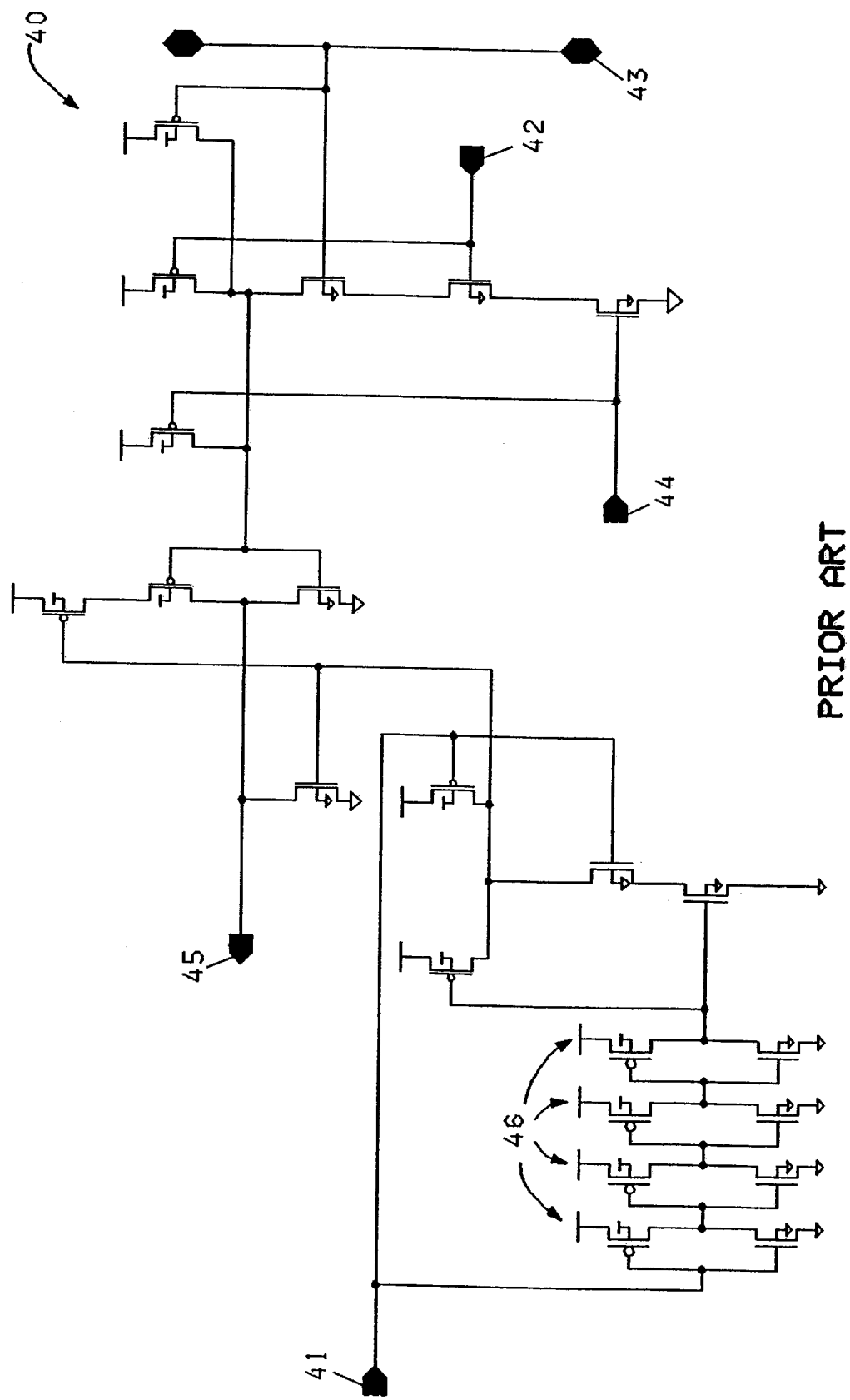
FIG. 3 is a diagram illustrating a prior art multi-port ram control circuit.

In FIG. 3 there is shown a prior art read decode select driver circuit 40 for use in conjunction with a multi-port ram such as shown in FIG. 1. In operation, input 41 is provided by a write through detection circuit which may be an address compare circuit as just described above. When active input 41 forces output 45 low which may be used to operate the bypass function such as controlling transfer gates 18 and 19. The chain of four inverters 46 is designed to stretch a signal applied at input 41 and therefore hold output 45 low for a longer time than would otherwise occur. Read gate input 43 and precharge input 42 become active during a normal or write through read operation. Input 44 is included for testing purposes and plays no part in the present invention. Input 44 is normally held in an up level during normal operation of the ram. The number of inverters in chain 46 can be increased or decreased in units of two inverters to provide some adjustment of the period of time output 45 is held low. In practice this level of adjustment has been found to not be sufficient to accommodate the variations noted above causing data errors to occur in operation of the multi-port ram.

Figure 4:
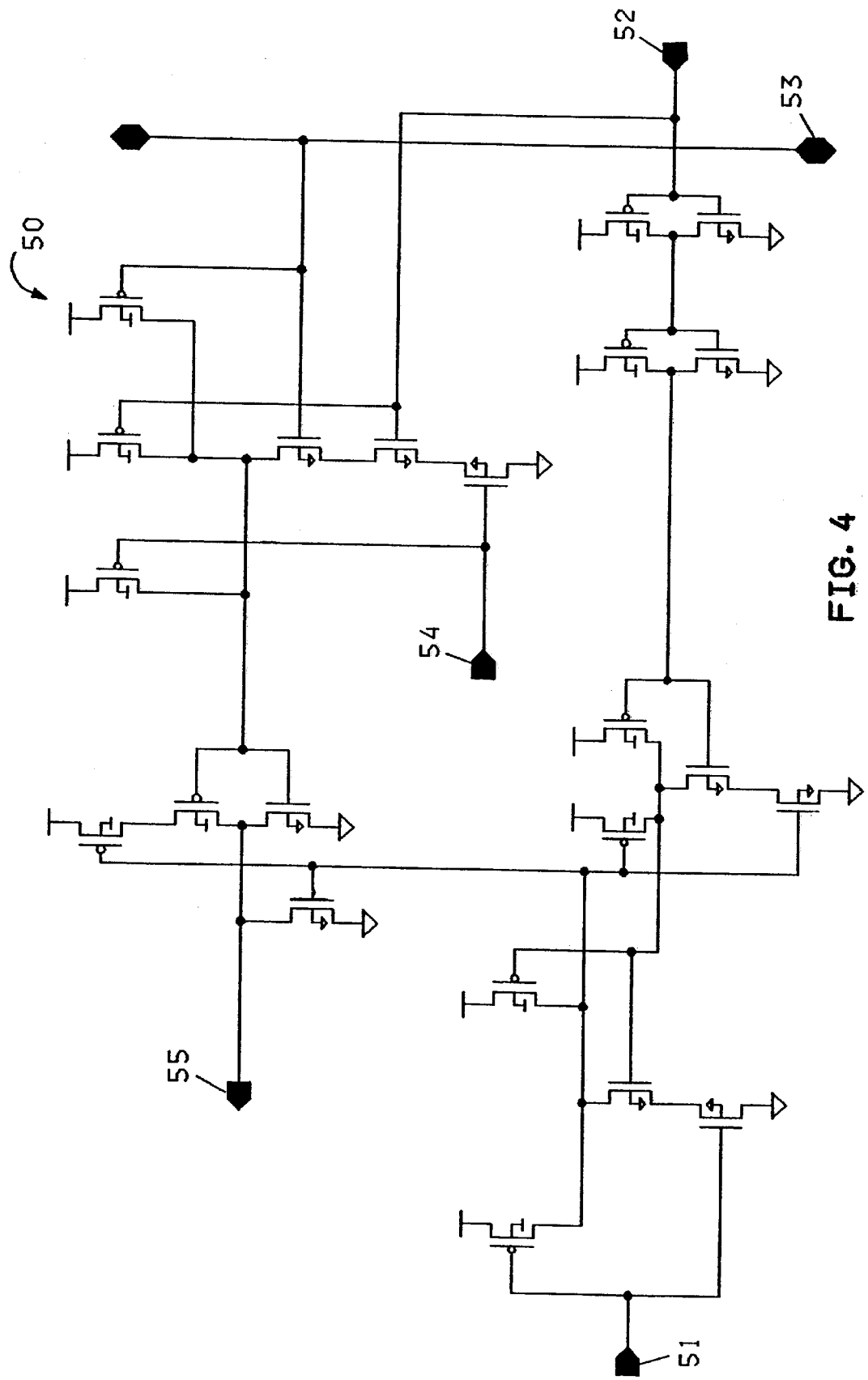
FIG. 4 is a diagram illustrating a control circuit in accordance with the present invention.

In FIG. 4 there is shown a read decode select drive 50 in accordance with the present invention. Precharge input 52 and read gate input 53 become active during a read operation including the read portion of a write through operation. Test input 54 is provided for testing purposes and not used during a read operation. Test input 54 is held constant in an up level logic state during a write through operation. Write through input 51 is enabled by a write through detection circuit. One such circuit is described above and partially shown in FIG. 2. Logical operation of the NMOS and PMOS devices in read decode select driver 50 operate by placing read control output 55 in an inactive state when a single pulse occurs on input 51 and holding read control output 55 in this inactive state until after read gate input 53 and precharge input 52 both return to an inactive state. Those of ordinary skill in CMOS logic arts can verify the design of driver 50 operates thusly.

Driver circuit 50 may be coupled to first 18 and second 19 transfer gates of a write through control apparatus such as shown in FIG. 1. One method of interconnecting output 55 with transfer gates 18 and 19 operates by placing the outputs of both transfer gates in a high impedance state as output 55 becomes inactive. Other interconnections will be obvious to those skilled in the art.

While there have been shown and described what are at present considered to be the preferred embodiments of the invention, it will be obvious to those skilled in the art that various changes and modifications may be made therein without departing from the scope of the invention as defined by the appended claims.

What is claimed is:

1. A write through control apparatus for a multi-port ram, comprising:

a clocked address comparator for generating a single pulse when a write through condition occurs; and a read decode select driver circuit coupled to said clocked address comparator, said read decode driver circuit having a read gate input and a precharge input both of which become active during a read of said ram, and a read control output which is placed in an inactive state when said single pulse occurs and is held in said inactive state until after said read gate input and said precharge input both return to an inactive state.

2. The apparatus of claim 1, wherein said apparatus is contained on a semiconductor chip.

3. The apparatus of claim 2, wherein said semiconductor chip is an ASIC chip.

4. A multi-port random access memory, comprising;

a memory cell having a data out signal;

a first transfer gate for bypass coupling a write port data signal to a read port;

a second transfer gate for coupling said data out signal to said read port;

an address comparator for determining when a write address at said write port and a read address at said read port are equal;

a driver circuit coupled to said address comparator, said driver circuit having a read gate input and a precharge input both of which are adapted to become active during a read of said random access memory, and a read control output which is adapted to enter an inactive state when said comparator determines an equal address condition and remain in said inactive state until after said read gate input and precharge input return to an inactive state; and wherein said first transfer gate is adapted to become active when said read control output is active; and said second transfer gate is adapted to become active when said read control output becomes inactive.

5. The random access memory of claim 4, wherein said memory is a compilable multi-port random access memory.

6. The random access memory of claim 4, wherein said memory is contained on a semiconductor chip.

7. The random access memory of claim 6, wherein said semiconductor chip is an ASIC chip.

8. The random access memory of claim 4, wherein said memory is a static random access memory.

9. The random access memory of claim 4, wherein said memory has two ports.

10. A method of operating a multi-port random access memory, comprising the steps of:

providing a memory cell having a data out signal;

comparing a write address at a write port of said memory and a read address at a read port of said memory to determine when said addresses are equal;

placing a read gate input and a precharge input in an active state during a read of said memory;

placing a read control output signal in an inactive state when said addresses are equal and said read gate input and said precharge input are both active;

holding said read control output signal in said inactive state until after said read gate input and said precharge input both return to an inactive state;

activating a first transfer gate for bypass coupling a write port data signal to a read port when said read control output is active; and activating a second transfer gate for coupling said data out signal to said read port when said read control output is inactive.

11. The method of claim 10, wherein said memory cell is provided as a static random access memory cell.

12. The method of claim 10, wherein said memory cell is provided with two ports.

* * * * *